(12) United States Patent
Bai et al.

(10) Patent No.: US 8,859,339 B2
(45) Date of Patent: *Oct. 14, 2014

(54) MOLD CHASE

(71) Applicants: Zhigang Bai, Tianjin (CN); Jinzhong Yao, Tianjin (CN)

(72) Inventors: Zhigang Bai, Tianjin (CN); Jinzhong Yao, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 60 days.

This patent is subject to a terminal disclaimer.

(21) Appl. No.: 13/794,789

(22) Filed: Mar. 12, 2013

(65) Prior Publication Data
US 2013/0196473 A1 Aug. 1, 2013

Related U.S. Application Data

(63) Continuation-in-part of application No. 13/170,206, filed on Jun. 28, 2011, now Pat. No. 8,525,311.

(30) Foreign Application Priority Data

Mar. 11, 2013 (CN) .......................... 2013 1 0074969

(51) Int. Cl.
  *H01L 21/56* (2006.01)
  *B29C 45/14* (2006.01)
  *B29C 70/72* (2006.01)
  *H03K 19/0185* (2006.01)

(52) U.S. Cl.
  CPC ..... *H01L 21/565* (2013.01); *H01L 2224/48091* (2013.01); *H01L 2224/48247* (2013.01); *H03K 19/018521* (2013.01); *H01L 2224/49109* (2013.01)

USPC ...... 438/123; 264/266; 264/272.17; 425/112; 425/116; 425/125; 438/127

(58) Field of Classification Search
USPC ............. 425/112, 116, 125; 264/266, 272.17; 438/123, 127
See application file for complete search history.

(56) References Cited

U.S. PATENT DOCUMENTS

| | | | | |
|---|---|---|---|---|
| 3,530,541 | A | * | 9/1970 | Burns ........................... 425/116 |
| 3,542,328 | A | * | 11/1970 | Deitrick ........................... 249/95 |
| 4,453,903 | A | * | 6/1984 | Pukaite ......................... 425/117 |
| 5,420,459 | A | | 5/1995 | Kozono |
| 5,557,143 | A | | 9/1996 | Seiji |
| 5,640,746 | A | | 6/1997 | Knecht |
| 5,914,529 | A | | 6/1999 | King |
| 6,008,073 | A | | 12/1999 | King |
| 6,025,640 | A | | 2/2000 | Yagi |

(Continued)

FOREIGN PATENT DOCUMENTS

JP          04-180668         6/1992

*Primary Examiner* — Robert B Davis
(74) *Attorney, Agent, or Firm* — Charles Bergere

(57) ABSTRACT

A mold chase for packaging a semiconductor die includes first and second toothed mold clamps, each having teeth, recesses located between the teeth, and an open cavity located in a center of the first mold clamp. The second mold clamp is in facing arrangement with the first mold clamp and the teeth in the first mold clamp mate with corresponding recesses in the second mold clamp and vice-versa. In an open position a lead frame can be inserted into one of the first or second mold clamps and in a closed position, the teeth and recesses of the first and second mold clamps bend leads of the lead frame into two spaced, planar rows.

18 Claims, 9 Drawing Sheets

(56) References Cited

U.S. PATENT DOCUMENTS

| | | |
|---|---|---|
| 6,078,099 A | 6/2000 | Liu |
| 6,201,294 B1 | 3/2001 | Lee |
| 6,305,921 B1 * | 10/2001 | Grams et al. ......... 425/116 |
| 6,388,311 B1 | 5/2002 | Nakashima |
| 7,102,214 B1 | 9/2006 | Miks |
| 7,102,216 B1 | 9/2006 | Foster |
| 8,188,582 B2 | 5/2012 | Seo |
| 8,525,311 B2 * | 9/2013 | Bai et al. ......... 257/676 |
| 8,610,253 B2 | 12/2013 | Yurino |
| 2004/0201080 A1 | 10/2004 | Basoor |
| 2007/0001278 A1 | 1/2007 | Jeon |
| 2007/0278633 A1 | 12/2007 | Uematsu |
| 2008/0290487 A1 | 11/2008 | Zhao |
| 2010/0001386 A1 | 1/2010 | Misumi |
| 2012/0056311 A1 * | 3/2012 | Bai et al. ......... 257/676 |
| 2013/0244381 A1 * | 9/2013 | Kamachi et al. ......... 438/123 |
| 2013/0249071 A1 * | 9/2013 | Yao et al. ......... 257/676 |

* cited by examiner

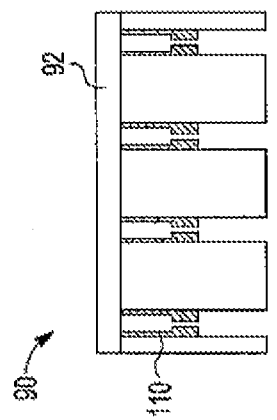
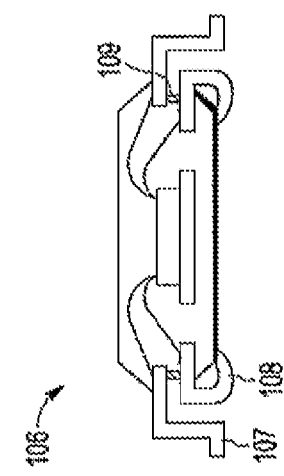
FIG. 9A
FIG. 9B
FIG. 9C
FIG. 9D

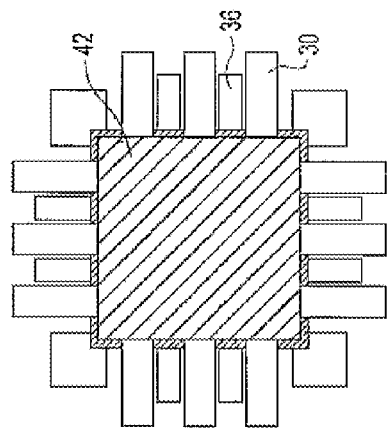
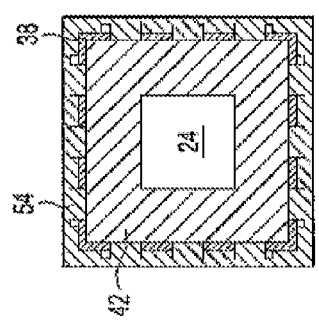
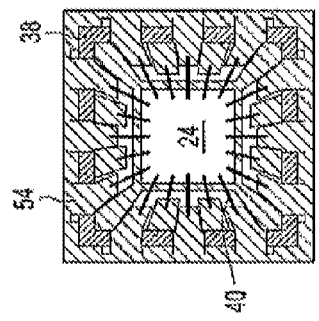
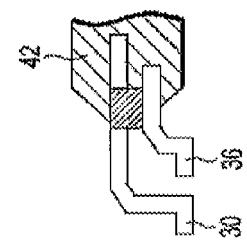
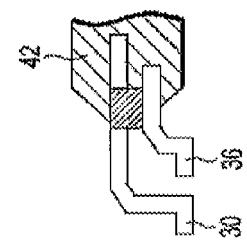
FIG. 13A
FIG. 12
FIG. 13C
FIG. 11
FIG. 13B

MOLD CHASE

CROSS-REFERENCE TO RELATED APPLICATIONS

This application is a continuation-in-part of currently pending U.S. application Ser. No. 13/170,206 filed on Jun. 28, 2011, and assigned to Freescale Semiconductor, Inc.

FIELD OF THE INVENTION

The present invention relates to semiconductor device assembly and, more particularly, to a mold chase for packaging an integrated circuit (IC) die.

BACKGROUND OF THE INVENTION

An integrated circuit (IC) die is a small device formed on a semiconductor wafer, such as a silicon wafer. Such a die is typically cut from the wafer and packaged using a lead frame. The lead frame is a metal frame, usually of copper or nickel alloy, that supports the IC and provides the external electrical connections for the packaged chip. A lead frame usually includes a flag or die pad, and lead fingers. Bond pads on the die are electrically connected to the leads of the lead frame via wire bonding. The die and bond wires are encapsulated with a protective material to form a package. The leads either project outwardly from the encapsulation or are at least flush with the encapsulation so they can be used as terminals, allowing the IC to be electrically connected to other devices or a printed circuit board (PCB).

Referring to FIG. 1, an enlarged cross-sectional view of a conventional semiconductor device 10 is shown. The device 10 includes a semiconductor die 12 attached to a die pad 14 and electrically coupled to lead fingers 16. The die 12, die pad 14, and parts of the lead fingers 16 are covered with a mold compound 18, which protects the die 12 and the electrical connections to the lead fingers 16 from being damaged. The lead fingers 16 project from the mold compound 18, which allows for external electrical connection of the die 12.

The number of leads is limited by the size of the package and the pitch of the leads. A package with many leads (high I/O count) is more expensive to produce than a package with fewer leads and a greater pitch. However, while there is a continual demand for smaller packages with more leads, decreasing the spacing between leads requires a more complex and more expensive test socket, increases the likelihood of open and short circuit rejects, and out of alignment leads, all of which increase cost. Thus, it would be advantageous to be able to assemble a semiconductor device with more I/Os in the same or a smaller size package while maintaining or lowering package cost.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments that are presently preferred. It should be understood, however, that the invention is not limited to the precise arrangements and instrumentalities shown. In the drawings:

FIG. 9A is a cross-sectional side view of a mold clamp in an open position in accordance with one embodiment of the invention, FIG. 9B is a cross-sectional side view of the mold clamp of FIG. 9A in a closed position with leads of a lead frame extending therefrom, FIG. 9C is a side, cross-sectional view of a finished device in accordance with an embodiment of the present invention, and FIG. 9D is a side, cross-sectional view of one section of the mold clamp of FIG. 9A including a resin step feature in accordance with an embodiment of the present invention;

FIG. 11 is an illustration of the lead frame and isolation frame assembly of FIG. 8 after a die attach and wire bonding process;

FIG. 12 is an illustration of the assembly shown in FIG. 11 after an encapsulation process, with a top portion of the mold removed for illustrative purposes;

FIG. 13A is a top plan view of the assembly shown in FIG. 12 after removal of the lead frame connection bar, FIG. 13B is an enlarged side view of a part of the packaged device of FIG. 13A showing part of a trim and form operation, and FIG. 13C illustrates the leads shown in FIG. 13B at the end of the trim and form operation;

DETAILED DESCRIPTION OF PREFERRED EMBODIMENTS

Figure 1:
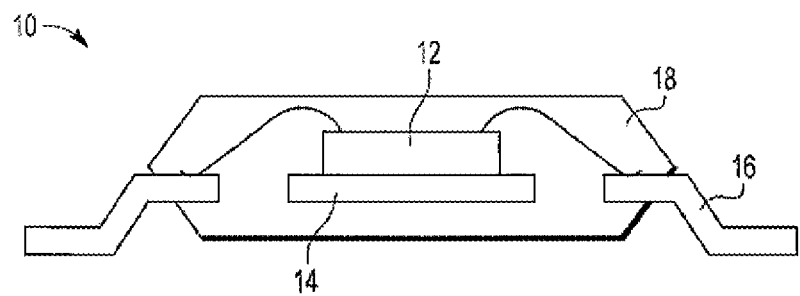
FIG. 1 is an enlarged cross-sectional view of a conventional packaged semiconductor device.

The detailed description set forth below in connection with the appended drawings is intended as a description of the presently preferred embodiments of the invention, and is not intended to represent the only forms in which the present invention may be practiced. It is to be understood that the same or equivalent functions may be accomplished by different embodiments that are intended to be encompassed within the spirit and scope of the invention. As will be understood by those of skill in the art, the present invention can be applied to various packages and package types.

Certain features in the drawings have been enlarged for ease of illustration and the drawings and the elements thereof are not necessarily in proper proportion. Further, the invention is shown embodied in a thin quad flat pack (TQFP) type package. However, those of ordinary skill in the art will readily understand the details of the invention and that the invention is applicable to other package types, such as QFP, LPQFP, SOIC, TSOP, etc. In the drawings, like numerals are used to indicate like elements throughout.

In order to provide a lead frame for a semiconductor device that allows for finer pitch, in one embodiment the present invention provides a lead frame that has a die pad with a first major surface for receiving an integrated circuit die. A connection bar encircles the die pad. First and second pluralities of lead fingers project from the connection bar towards the die pad, and have proximal ends close to but spaced from the die pad and distal ends connected to the connection bar. The proximal ends of the first plurality of lead fingers lie in a first plane and the proximal ends of the second plurality of lead fingers lie in a second plane that is parallel to and spaced from the first plane. An isolation frame formed from a rigid or semi-rigid material is spaced from and encircles the die pad and is disposed between the proximal ends of the first and second pluralities of lead fingers, and isolates the proximal ends from each other. In one embodiment, the isolation frame includes grooves within which the proximal ends of the lead fingers are seated.

The present invention further provides a method of packaging a semiconductor die, including the steps of:

providing a sheet of conductive metal and forming a die pad in the conductive sheet;

forming a plurality of lead fingers in the conductive sheet, wherein the plurality of lead fingers extend from a connection bar that encircles the die pad, toward the die pad, wherein the plurality of lead fingers have a distal end connected to the connection bar and a proximal end near the die pad;

separating the plurality of lead fingers into first and second sets of lead fingers, wherein the proximal ends of the first set of lead fingers lie in a first plane and the proximal ends of the second set of lead fingers lie in a second plane that is parallel with and spaced from the first plane;

installing an isolation frame in the space between the first and second sets of lead fingers, wherein the isolation frame encircles and is spaced from the die pad and isolates the proximal ends of the first and second sets of lead fingers from each other;

attaching a semiconductor die to the die pad and electrically coupling contact pads on the die with the proximal ends of respective ones of the plurality of lead fingers;

encapsulating at least the die, the die pad and the proximal ends of the plurality of lead fingers with a mold compound; and removing the connection bar, wherein the distal ends of the plurality of lead fingers project outwardly from the mold compound. In a further embodiment, the outwardly projecting lead fingers are bent such that two rows of leads are formed that surround the encapsulated die.

In yet another embodiment, the present invention provides a semiconductor device that has a die pad for receiving an integrated circuit die; a first plurality of lead fingers that are spaced from and project outwardly from the die pad, a second plurality of lead fingers that are spaced from and project outwardly from the die pad, and an isolation frame that is spaced from and encircles the die pad. The first and second pluralities of lead fingers have proximal ends close to the die pad and distal ends farther from the die pad. The proximal ends of the first plurality of lead fingers lie in a first plane, and the proximal ends of the second plurality of lead fingers lie in a second plane that is spaced from and parallel with the first plane. The isolation frame is disposed in the space between the proximal ends of the first and second pluralities of lead fingers and isolates the proximal ends of the first and second pluralities of lead fingers from each other. An integrated circuit die is attached to a surface of the die pad and bonding pads on the die are electrically connected to respective ones of the proximal ends of the first and second pluralities of lead fingers with bond wires. An encapsulation material surrounds at least the die pad, the die, the isolation frame, and the proximal ends of the first and second pluralities of lead fingers. The distal ends of the first and second pluralities of lead fingers project outwardly from the encapsulation material and allow for external electrical connection with the integrated circuit die. The distal ends of the first and second plurality of lead fingers may be bent or cut (viz. trim and form) as desired to form various package types, such as QFP or TQFP, etc. In one embodiment, the die pad lies in the first plane.

In order to provide a lead frame for a semiconductor device that allows for finer pitch, in another embodiment the present invention provides a mold chase for packaging a semiconductor die, the mold chase comprising: a first toothed mold clamp having a plurality of teeth, a corresponding plurality of recesses located between the teeth and an open cavity located in a center of the first mold clamp; and a second toothed mold clamp having a plurality of teeth, a corresponding plurality of recesses located between the teeth and an open cavity located in a center of the second mold clamp. The second mold clamp is in facing arrangement with the first mold clamp and the teeth in the first mold clamp mate with corresponding recesses in the second mold clamp and vice-versa. In an open position of the mold chase, a lead frame can be inserted into one of the first and second mold clamps and in a closed position, the teeth and recesses of the first and second mold clamps bend leads of the lead frame into two spaced, planar rows.

The present invention further provides a method of packaging a semiconductor die, including the steps of:

providing a lead frame having a die attach area and a plurality of leads extending from a connection bar that encircles the die attach area towards the die attach area, wherein the plurality of leads have a distal end connected to the connection bar and a proximal end near the die attach area;

attaching a semiconductor die to the die attach area;

electrically coupling contact pads on the semiconductor die with the proximal ends of respective ones of the plurality of leads;

providing a mold chase comprising:

a first toothed mold clamp having a plurality of teeth, a corresponding plurality of recesses located between the teeth and an open cavity located in a center of the first mold clamp, and a second toothed mold clamp having a plurality of teeth, a corresponding plurality of recesses located between the teeth and an open cavity located in a center of the second mold clamp, wherein the second mold clamp is in facing arrangement with the first mold clamp and wherein the teeth in the first mold clamp mate with corresponding recesses in the second mold clamp and vice-versa;

inserting the lead frame and the semiconductor die into one of the first and second mold clamps while the mold chase is in an open position;

clamping the first and second mold clamps to put the mold chase in a closed position, wherein the teeth and recesses of the first and second mold clamps act together to bend the leads of the lead frame into two spaced, planar rows;

injecting mold compound into the cavity of the mold chase to encapsulate at least the die, the die attach area and the proximal ends of the plurality of leads; and removing the connection bar, wherein the distal ends of the plurality of leads project outwardly from the mold compound. In a further embodiment, the outwardly projecting leads are bent such that two rows of leads are formed that surround the encapsulated die.

Figure 2A:
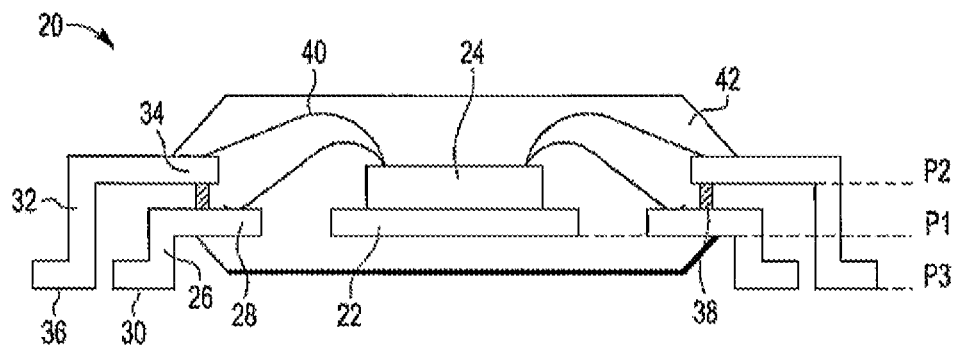
FIG. 2A is an enlarged cross-sectional view and FIG. 2B is an enlarged side view of a packaged semiconductor device in accordance with one embodiment of the present invention.

Referring now to FIG. 2A, an enlarged cross-sectional view of a packaged semiconductor device 20 in accordance with an embodiment of the invention is shown. The semiconductor device 20 includes a die pad 22 for receiving an integrated circuit die 24. The die 24 is preferably of a type known to those of skill in the art, such as a circuit formed on and cut from a silicon wafer. Typical die sizes may range from 1.5 mm×1.5 mm to 12 mm×12 mm. The die 24 may have a thickness ranging from about 6 mils to about 21 mils. The die pad 22 is sized and shaped to receive the die 24. As various size die are known, it is understood that the size and shape of the die pad 22 will depend on the particular die being packaged. The die 24 preferably is attached to the die pad 22 with an adhesive (not shown) as is known by those of skill in the art.

The semiconductor device 20 includes a first plurality of lead fingers 26 that are spaced from and project outwardly from the die pad 22. The lead fingers 26 have proximal ends 28 close to but spaced from the die pad 22 and distal ends 30 farther from the die pad 22. Further, in one embodiment of the invention, the die pad 22 and the proximal ends 28 of the first plurality of lead fingers 26 lie in a first plane P1. Thus far, the device 20 is similar to the conventional device 10 of FIG. 1.

The semiconductor device 20 also has a second plurality of lead fingers 32 that are spaced from and project outwardly from the die pad 22. The second plurality of lead fingers 32 has proximal ends 34 close to but spaced from the die pad 22 and distal ends 36 farther from the die pad 22. The proximal ends 34 of the second plurality of lead fingers 32 lie in a second plane P2 that is spaced from and parallel with the first plane P1. Although as depicted in the drawing, in the embodiment shown the second plane P2 lies above or over the first plane P1, this is not a requirement, as in alternative embodiments, the second plane P2 could lie below or beneath the first plane P1.

Figure 2B:
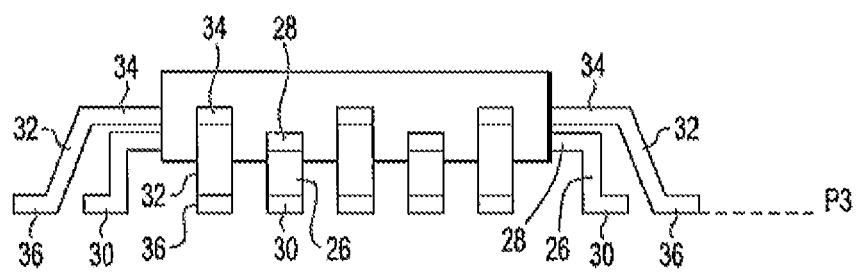

FIG. 2B is a side view of the semiconductor device 20 of FIG. 2A and more clearly shows how the distal ends 30 and 36 of the first and second pluralities of lead fingers 26 and 32 lie in a third plane P3 that is parallel with the first and second planes P1 and P2. However, it will be understood by those of skill in the art that the pluralities of lead fingers 26 and 32 may be trimmed and/or formed, for example such that the lead fingers 26 and 32 need not be bent such as in a gull-wing shape, but could have other shapes.

Referring again to FIG. 2A, the semiconductor device 20 has an isolation frame 38 that is spaced from and encircles the die pad 22. The isolation frame 38 is disposed in a space between the proximal ends 28 and 34 of the first and second pluralities of lead fingers 26 and 32, and thus in the space between the first and second planes P1 and P2. The isolation frame 38 functions to electrically isolate the proximal ends 28 and 34 of the first and second pluralities of lead fingers 26 and 32 from each other. That is, the isolation frame 38 mechanically and electrically separates the proximal ends 28 and 34 of the first and second lead fingers 26 and 32 from each other.

It is preferred that the isolation frame 38 be formed of a rigid material so that it provides support to the lead fingers during wire bonding and encapsulation processes. In one embodiment of the invention, the isolation frame 38 is formed of a thermoplastic resin, such as polytetrafluoroethylene (PTFE), perfluoroalkoxy (PFA) or fluorinated ethylene propylene (FEP). These materials provide suitable rigidity to seal the mold cavity during molding so that the encapsulation material will not bleed and also are electrically nonconductive. Moreover, they have a long life time, as the semiconductor devices described herein may be used, for example, in automotive applications, which require twenty or more years of life in adverse conditions.

The semiconductor or integrated circuit die 24, in the embodiment shown, is electrically connected to the lead fingers 26 and 32 with wires 40 that extend from bonding pads on the die to respective ones of the proximal ends 28 and 34 of the first and second pluralities of lead fingers 26 and 32. The wires 40 and wire bonding processes are well known to those of skill in the art and a detailed explanation thereof need not be provided here for a full understanding of the invention.

An encapsulation material 42 surrounds at least the die pad 22, the die 24, the isolation frame 38, and the proximal ends 28 and 34 of the first and second pluralities of lead fingers 26 and 32, whereas the distal ends 30 and 36 of the first and second pluralities of lead fingers 26 and 32 project outwardly from the encapsulation material 42 and allow for external electrical connection with the integrated circuit die 24. Such encapsulation processes are well known. Although FIG. 2A shows the die pad 22 being completely encapsulated with the encapsulation material 42, the die pad 22 could have an exposed bottom surface, in which case the encapsulation material 42 would cover only the sides and portions of the top surface of the die pad 22 not already covered by the die 24 and die attach material.

The die pad 22 and the lead fingers 26 and 32 form a lead frame. As is known, a lead frame may be formed of electrically conductive metal like copper or a metal alloy. FIGS. 3 to 10 show various stages in the fabrication of a lead frame in accordance with embodiments of the present invention. Although the drawings show the formation of only one lead frame, it will be understood by those of skill in the art that a plurality of lead frames may be formed simultaneously on a single sheet or roll of conductive metal.

Figure 3:
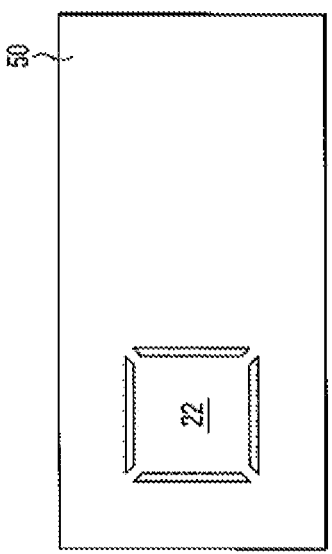
FIG. 3 is a top plan view of a sheet of conductive material used for forming a lead frame in accordance with the present invention.
Figure 4:
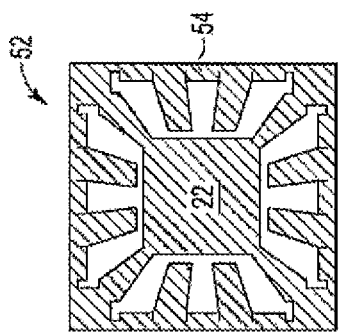
FIG. 4 is a top plan view showing the formation of lead fingers in one of the lead frames being formed in the sheet of material of FIG. 3.

Referring now to FIG. 3, a sheet of conductive metal 50 is provided and the die pad 22 is formed therein, such as by a metal stamping process, as is known in the art. In one embodiment of the invention, the sheet of conductive metal 50 comprises copper. A plurality of lead fingers 52, shown in FIG. 4, may be formed by cutting the metal sheet 50. The lead fingers 52 extend from a connection bar 54 that encircles the die pad 22, toward the die pad 22. The lead fingers 52 have a distal end connected to the connection bar 54 and a proximal end near the die pad 22. In one embodiment of the invention, the dam bar 54 lies in the same plane as the die pad 22 and in other embodiments, the dam bar 54 and the lead fingers lie in different planes. In one example, the die pad 22 lies in a plane that is parallel to and below the first plane P1.

Figure 5:
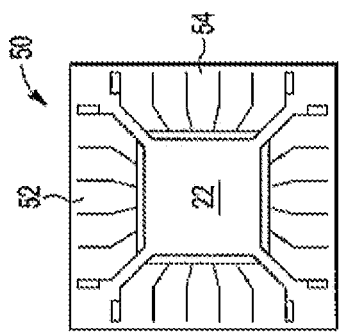
FIG. 5 is a top plan view illustrating the bending of alternate lead fingers in the lead frame shown in FIG. 4.

FIG. 5 shows the lead fingers 52 being separated into first and second pluralities of lead fingers 26 and 32, which in one embodiment of the invention is done by bending alternate ones of the lead fingers 52, with the bent lead fingers comprising the second plurality of lead fingers 32. Thus, the first and second pluralities of lead fingers 26 and 32 are interleaved. The bent or second plurality of lead fingers 32 may include an additional bend such that the lead fingers 26 and 32 all lie in parallel planes, and as discussed above, in one embodiment the first plurality of lead fingers 26 lie in the same plane as the die pad (see FIGS. 2A and 2B) and the second plurality of lead fingers 32 having proximal ends that are in a parallel plane P2 that is spaced from the first plane P1. If necessary, the proximal ends 28 and 34 of the lead fingers 26 and 32 also may be trimmed, as is known in the art.

Figure 6A:
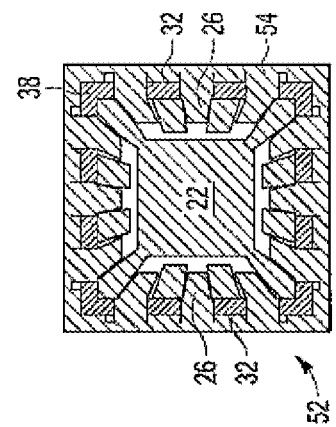
FIGS. 6A and 6B are a top plan view and a side view of an isolation frame in accordance with one embodiment of the present invention.
Figure 6B:
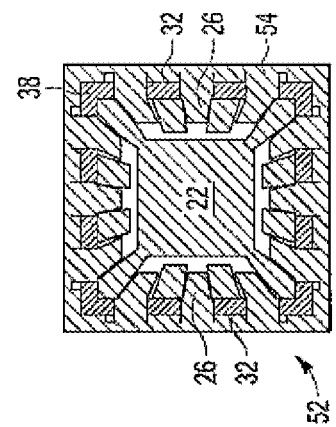

FIGS. 6A and 6B show the isolation frame 38, which is installed between the proximal ends of the first and second pluralities of lead fingers 26 and 32. Thus, in FIG. 5, the alternate leads are bent at a near 90° angle from the other leads so that the isolation frame 38 can be installed between alternating leads. The isolation frame 38 encircles and is spaced from the die pad 22 and isolates the proximal ends 28 and 34 of the first and second sets of lead fingers 26 and 32 from each other, both physically and electrically. It is preferred that the isolation frame 38 be formed of a rigid material so that it provides adequate support to the lead fingers 26 and 32 during wire bonding and encapsulation processes. In one embodiment of the invention, the isolation frame 38 is formed of Teflon®. In one embodiment of the invention, the isolation frame 38 includes a first plurality of grooves 56 within which the proximal ends 28 of the first plurality of lead fingers 26 are seated, and a second plurality of grooves 58 within which the proximal ends 34 of the second plurality of lead fingers 32 are seated. As can be seen in FIG. 6B, the first and second pluralities of grooves 56 and 58 are formed on opposing sides of the isolation frame 38.

One method of forming the isolation frame 38 of the present invention is to start with a molded block of polymeric material, as described above, and then etch and/or drill the grooves 56, 58 for seating the leads into the upper and lower surfaces of the isolation frame 38. Drilling may be by mechanical, chemical or laser drilling. Alternatively, a casting or plating process may be performed on a patterned block to form the isolation frame 38.

Figure 7:
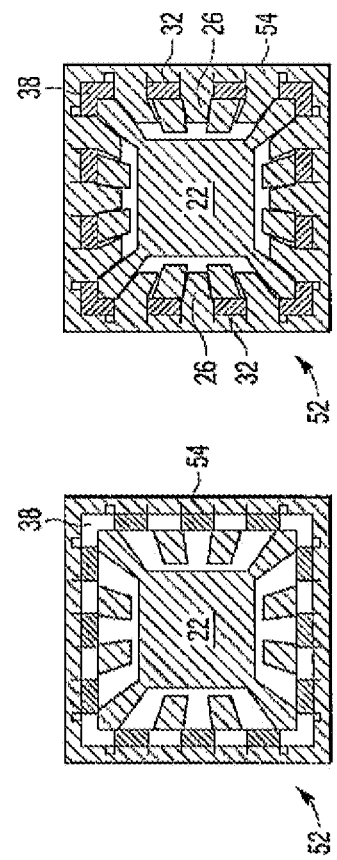
FIG. 7 is a top plan view of the lead frame of FIG. 5 with the isolation frame of FIG. 6A installed therein.
Figure 8:
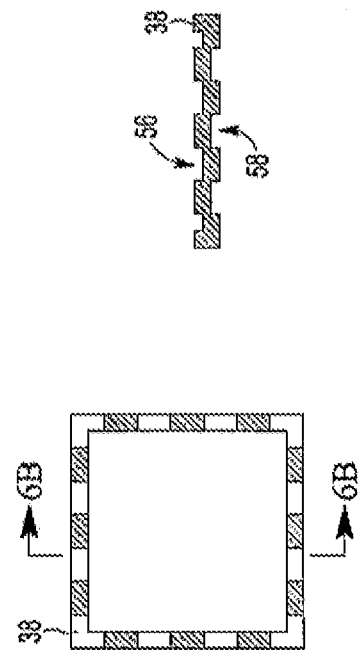
FIG. 8 is a top plan view of the lead frame and isolation frame assembly of FIG. 7 undergoing an additional lead finger bending process.

FIG. 7 shows the isolation frame 38 installed in the lead frame 50 between the first and second pluralities of lead fingers 26 and 32. FIG. 8 shows the second plurality of lead fingers 32 after being bent back such that the isolation frame 38 is held between and separates the first and second pluralities of lead fingers 26 and 32. That is, one way of installing the isolation frame 38 so that it is between and separates the first and second pluralities of lead fingers 26 and 32, and particularly the proximal ends 28 and 34 thereof, is to bend the proximal ends of the second plurality of leads 32, install the frame 38, and then bend the second leads 32 back.

FIGS. 9A through 9D show how, in an alternative embodiment of the invention, the isolation frame 38 is formed of a mold compound using a toothed mold clamp. FIG. 9A shows a mold chase 90 having upper and lower (or first and second) mold clamps 92 and 94. The mold clamps 92 and 94 are toothed such that a tooth 96 in the clamp 92 mates with a corresponding recess 98 in the clamp 94, and vice-versa, a tooth in the mold clamp 92 mates with a recess 98 in the clamp 98. The tooth 96 and recess 98 also preferably are chamfered. A lead frame, i.e., one formed from a conductive sheet that has had a die pad and leads formed by cutting, punching, or etching, and where proximal ends of the leads (the ends closest to the die pad) of alternate leads are bent so that the proximal ends of the leads lie in parallel but spaced planes, as discussed with the embodiment shown in FIG. 2A, is provided. A die is then attached to the die pad on one of its major surfaces with an adhesive, and bond wires are used to electrically connect the integrated circuit of the die to the leads of the lead frame. Then, after die bonding and wire bonding, the lead frame is installed in one of the upper and lower mold clamps 92 and 94. The mold clamp teeth 96 (and the corresponding recesses 98) contact the lead frame between the proximal and distal ends of the lead fingers and maintain the spaced plane configuration of the alternate lead fingers.

FIG. 9B shows the mold chase 90 in a closed position and an encapsulation material has been injected into the mold chase 90. As can be seen, two rows of leads 102 and 104 project from the mold chase 90. The projecting leads 102 and 104 can then undergo trim and form operations such that a QFP type package with two rows of leads extending from its sides is formed.

FIG. 9C is a cross-sectional view illustrating an example of a QFP type package 106 where the distal ends of the leads have been bent during trim and form operations in manner different from that shown in FIGS. 2A and 2B, such that the finished package has a different foot print from that shown in FIGS. 2A and 2B. More specifically, outer leads 107 have distal ends that are bent outwardly and inner leads 108 have distal ends that are bend inwardly. The package 106 also includes the isolation frame 109 between proximal ends of the inner and outer leads 107, 108.

FIG. 9D is a top view of the mold chase 90 illustrating a resin stop feature 110, which is used to reduce the mold flow speed of the mold compound injected into the mold chase 90 and inhibit mold compound bleeding during molding operations. One embodiment of the resin stop feature 110 is a pocket design that provides a space to hold the mold compound during the mold injection process.

Figure 10:
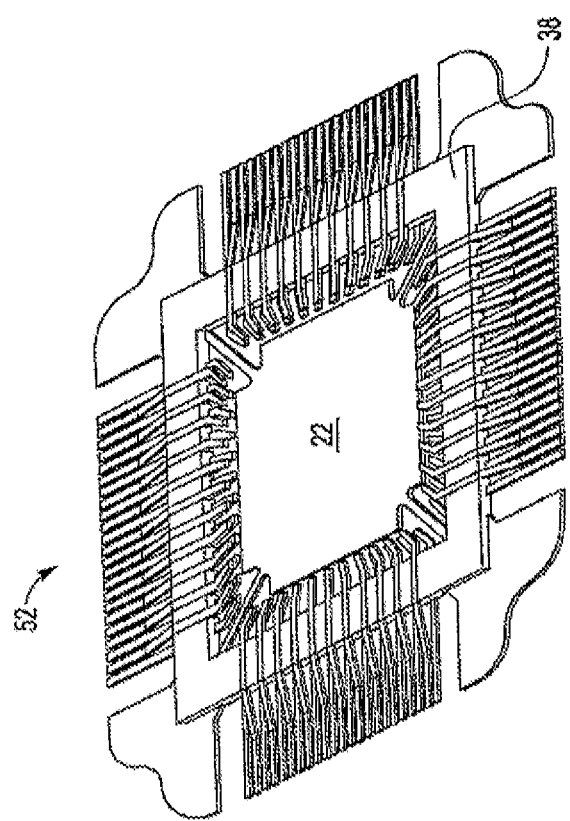
FIG. 10 is a greatly enlarged perspective view of an isolation frame installed in the lead frame shown in FIG. 5.

FIG. 10 is an enlarged, cut-away perspective view of the isolation frame 38 once installed between the lead fingers 52 of the lead frame. Note, FIG. 10 does not show the connection bar 54, which is later cut away as discussed in more detail below.

FIG. 11 illustrates the die 24 after attachment to one of the major surfaces of the die pad 22, and die pads (not shown) of the die 24 have been electrically connected to the leads 26 and 32 at their proximal ends 28 and 34 with wires 40 via a conventional wire bonding process. The die attach and wire bonding processes are well known to those of skill in the art.

FIG. 12 is an illustration of the lead frame after die attach and wire bonding, and encapsulation. In FIG. 12, the encapsulant 42 actually covers the die 24 and wires 40, although in FIG. 12 the die 24 is shown for illustrative purposes only. The encapsulant 42 covers the die pad 22, die 24, wires 40 and proximal ends 28 and 34 of the lead fingers 26 and 32.

FIGS. 13A, 13B and 13C illustrate removal of the connection bar 54 and trim and form operations being performed such that a device having two rows of leads extending from its sides is formed. Connection bar removal and trim and form operations are well known in the art so one of skill in the art viewing FIGS. 13A-13C will understand how the final package 20 is formed. Once the connection bar 54 has been removed (FIG. 13A), the distal ends 30 and 36 of the plurality of lead fingers 26 and 32 project outwardly from the encapsulant 42. Then, as shown in FIGS. 13B and 13C, the lead fingers are bent near a central area so that their distal ends lie in a plane that is parallel to the first and second planes (see also FIG. 2A).

The lead fingers 26 and 32 are disposed in spaced planes to avoid shorting issues between adjacent leads because the gap between leads may be very narrow. Shorting may be caused not simply by mishandling, but also during molding as the mold compound can push adjacent leads against each other. The isolation frame 38 provides a clamping area on which the mold tool can rest during molding. For the embodiment where the isolation frame is formed with the mold compound (i.e., a no-spacer case), the mold tool includes teeth matching the upper and lower level of inner leads to seal the cavity into which the mold compound is injected (FIGS. 9A and 9B).

Figure 14A:
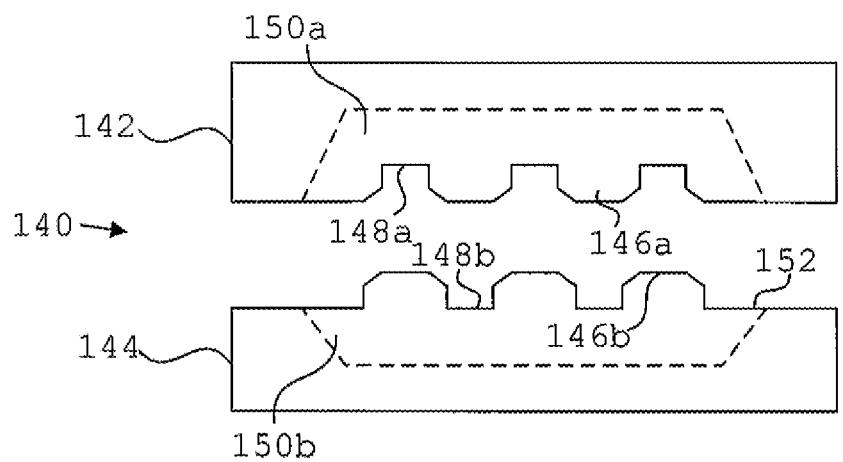
FIG. 14A is an enlarged side view of a mold chase in an open position in accordance with one embodiment of the present invention.

FIG. 14A is an enlarged side view of an embodiment of a mold chase 140 in an open position for packaging a semiconductor die (not shown). The mold chase 140 includes first and second toothed mold clamps 142 and 144. The first mold clamp has a plurality of teeth 146a, a corresponding plurality of recesses 148a located between the teeth 146a, and an open cavity 150a located in a center of the first mold clamp 142. The second mold clamp 144 also has a plurality of teeth 146b, a corresponding plurality of recesses 148b located between the teeth 146b, and an open cavity 150b located in a center of the second mold clamp 144. The second mold clamp 144 is in facing arrangement with the first mold clamp 142 such that the teeth 146a of the first mold clamp 142 mate with corresponding recesses 148b of the second mold clamp 144 and vice-versa. In a preferred embodiment, an outer edge 152 located adjacent to an outermost tooth 146b of the second mold clamp 144 is removed. In another preferred embodiment, the teeth 146a of the first mold clamp 142 are wider than the corresponding recesses 148b of the second mold clamp 144. In a further preferred embodiment, the teeth 146a and 146b of the first and second mold clamps 142 and 144 are chamfered.

Figure 14B:
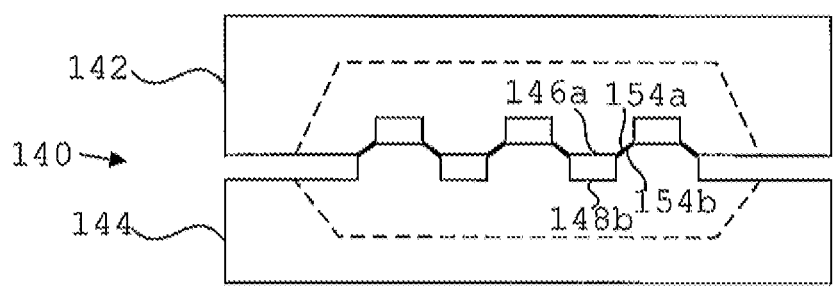
FIG. 14B is an enlarged side view of a mold chase in a closed position in accordance with one embodiment of the present invention.

FIG. 14B is an enlarged side view of the mold chase 140 in a closed position. The teeth 146a of the first mold clamp 142 have chamfered edges 154a that mate with chamfered edges 154b of the corresponding recesses 148b of the second mold clamp 144. Further, as can be seen, the teeth 146a and 146b do not extend entirely into the opposing recesses 148a and 148b. In a preferred embodiment, the chamfer 158 is formed by a precision wire cutting process in order to avoid resin bleed at the chamfered edges that could otherwise be caused due to imprecise tooling.

Figure 15A:
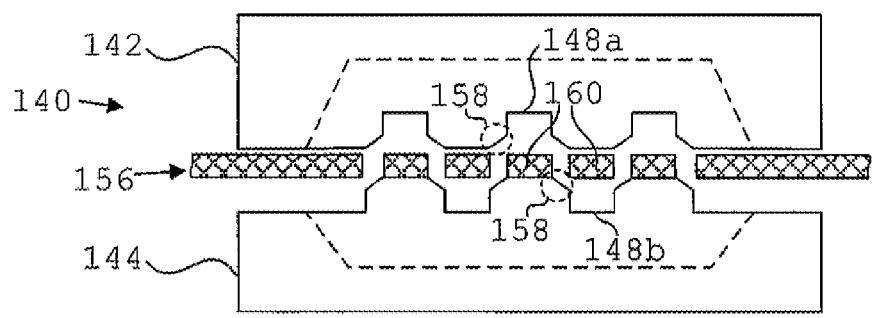
FIG. 15A is an enlarged side view of a mold chase in an open position with a lead frame inserted between the first mold clamp and the second mold clamp.

FIG. 15A is an enlarged side view of the mold chase 140 in an open position with a lead frame 156 having leads 160 inserted between the first and second mold clamps 142 and 144. When clamping the first and the second mold clamps 142, 144 to put the mold chase 140 in the closed position, the chamfers 158 act as guides to align the leads 160 of the lead frame 156 within the recesses 148a and 148b of the first and second mold clamps 142 and 144 to avoid mold tool jam due to lead frame deformation.

Figure 15B:
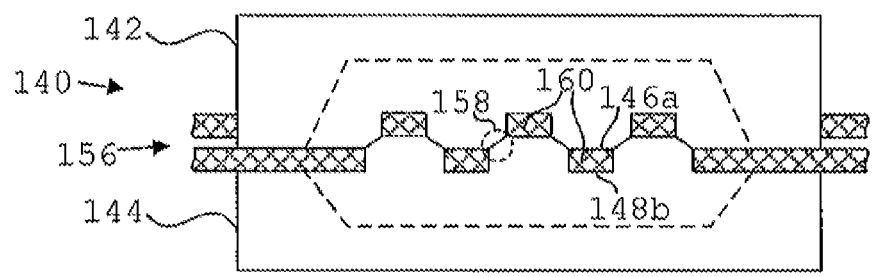
FIG. 15B is an enlarged side view of a mold chase in a closed position bending leads of a lead frame into two spaced, planar rows.

FIG. 15B is an enlarged side view of the mold chase 140 in a closed position. In the closed position, the leads 160 of the lead frame 156 are bent into two spaced, planar rows. In another preferred embodiment, in the closed position, distal ends of the teeth 146a of the first mold clamp 142 are spaced from proximal ends of the corresponding recesses 148b of the second mold clamp 144 with a distance less than a thickness of the leads 160 of the lead frame 156 such that there are no gaps between the leads 160 and the recesses 148b in the second mold clamp 144 when the leads 158 are pressed into the recesses 148b in the second mold clamp 144 by the corresponding teeth 146a in the first mold clamp 142. As a result, during the molding process, resin bleed at the gaps between the leads 160 and the mold clamps 142, 144 can be avoided. In a preferred embodiment, in the closed position the distance between the distal ends of the teeth 146a of the first mold clamp 142 and the proximal ends of the corresponding recesses 148b of the second mold clamp 144 is less than a thickness of the leads 158 of the lead frame 156 by 5 μm to 15 μm.

FIGS. 16A-16D are a series of cross-sectional views illustrating the steps in packaging a semiconductor die using a mold chase in accordance with an embodiment of the present invention. Starting from FIG. 16A, a semiconductor die 162 is attached to a die attach area 164 of the lead frame 156, which has a plurality of leads 160 extending from a connection bar 166 that encircles the die attach area 164 towards the die attach area 164, which is well known in the art. The leads 160 each have a distal end 168 connected to the connection bar 166 and a proximal end 170 near the die attach area 164. Contact pads (not shown) on the semiconductor die 162 are electrically connected to the proximal ends 170 of respective ones of the plurality of leads 160 with bond wires 172 using known wire bonding processes.

Figure 16A:
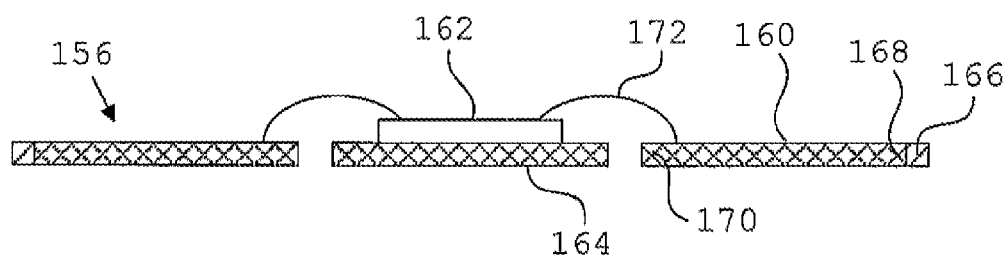
FIGS. 16A-16D are a series of diagrams illustrating the steps in packaging a semiconductor die using a mold chase in accordance with an embodiment of the present invention.
Figure 16B:
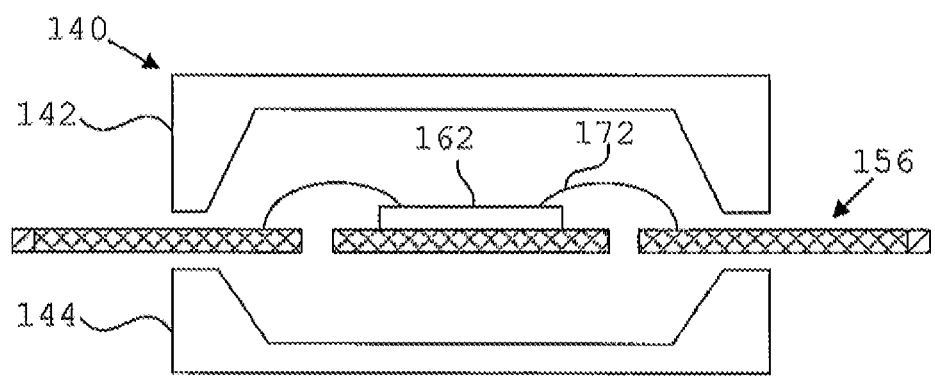

In the next step, illustrated in FIG. 16B, the lead frame 156, the semiconductor die 162, and attached bond wires 172 are placed into the mold chase 140 between the first and second mold clamps 142 and 144 while the mold chase 140 is in an open position.

Figure 16C:
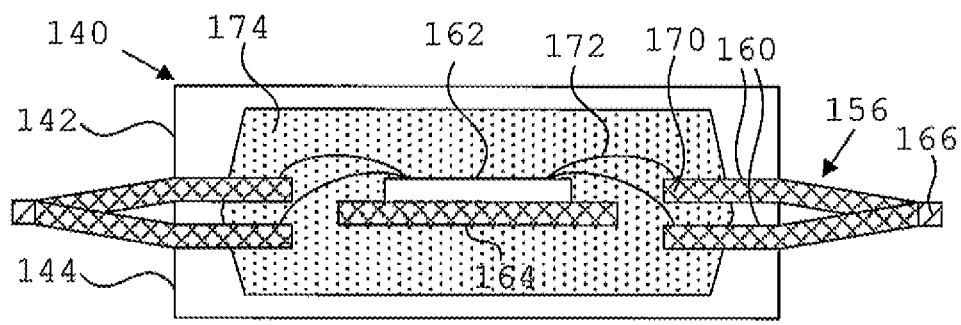

In the next step illustrated in FIG. 16C, the first mold chase 160 is closed. Therefore, as previously illustrated in FIG. 15A, the teeth 146 and recesses 148 of the first and second mold clamps 142, 144 act together to bend the leads 160 of the lead frame 156 into two spaced, planar rows. Then mold compound 174 is injected into the mold chase 140 to encapsulate at least the semiconductor die 162, the die attach area 164, the bond wires 172 and the proximal ends 170 of the plurality of leads 160 with the mold compound 174.

Figure 16D:
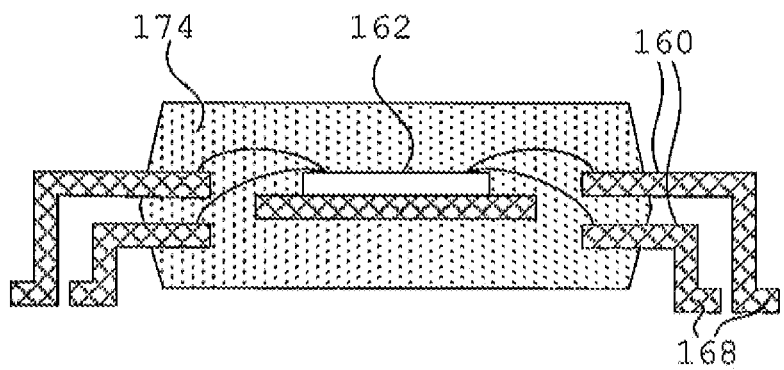

In the last step illustrated in FIG. 16D, the mold chase 140 is opened and the encapsulated assembly removed from the mold chase 140 and a trim and form process is conducted in which the connection bar 166 illustrated in FIG. 16C is removed and the distal ends 168 of the plurality of leads 160, which project outwardly from the mold compound 174 in two spaced, planar rows, are bent such that two rows of leads 160 are formed that surround the encapsulated semiconductor die 162, as shown.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. For example, a lead frame without a die pad could be formed, as could a lead frame with two or more die pads. A heat sink could be attached to a top surface of the die or to a bottom surface of the die pad. In addition, the die and die pad sizes may vary to accommodate the required package design. Also, one or more die could be stacked one atop the other to form a stacked die package. In addition, as previously discussed, the distal ends of the lead fingers could be bent, for example, such that the finished device would have one, two or more rows of leads at each side. It is understood, therefore, that this invention is not limited to the particular embodiments disclosed, but covers modifications within the spirit and scope of the present invention as defined by the appended claims.

The invention claimed is:

1. A mold chase for packaging a semiconductor die, the mold chase comprising:
 a first toothed mold clamp having a plurality of teeth, a corresponding plurality of recesses located between the teeth and an open cavity located in a center of the first mold clamp; and
 a second toothed mold clamp having a plurality of teeth, a corresponding plurality of recesses located between the teeth and an open cavity located in a center of the second mold clamp, wherein the second mold clamp is in facing arrangement with the first mold clamp and wherein the teeth in the first mold clamp mate with corresponding recesses in the second mold clamp and vice-versa, wherein in an open position a lead frame can be inserted into one of the first and second mold clamps and in a closed position, the teeth and recesses of the first and second mold clamps bend leads of the lead frame into two spaced, planar rows.

2. The mold chase of claim 1, wherein the teeth of the first mold clamp are wider than the corresponding recesses of the second mold clamp.

3. The mold chase of claim 2, wherein the teeth of at least one of the first and second mold clamps are chamfered, wherein the chamfers act as guides to align the leads of the lead frame within the recesses of the at least one of the first and second mold clamps.

4. The mold chase of claim 3, wherein the chamfer is formed by a wire cutting process.

5. The mold chase of claim 3, wherein the teeth of both the first and second mold clamps are chamfered and chamfered edges of the teeth of the first mold clamp mate with chamfered edges of the corresponding recesses of the second mold clamp.

6. The mold chase of claim 1, wherein in the closed position distal ends of the teeth of the first mold clamp are spaced from proximal ends of the corresponding recesses of the second mold clamp.

7. The mold chase of claim 6, wherein in the closed position a distance between the distal ends of the teeth of the first mold clamp and the proximal ends of the corresponding recesses of the second mold clamp is less than a thickness of the leads of the lead frame such that there are no gaps between the leads and the recesses in the second mold clamp when the leads are pressed into the recesses in the second mold clamp by the corresponding teeth in the first mold clamp.

8. The mold chase of claim 7, wherein in the closed position the distance between the distal ends of the teeth of the first mold clamp and the proximal ends of the corresponding recesses of the second mold clamp is less than a thickness of the leads of the lead frame by 5 µm to 15 µm.

9. The mold chase of claim 1, wherein an outer edge located adjacent to an outermost tooth of the second mold clamp is removed.

10. A method of packaging a semiconductor die using a mold chase, the method comprising:
providing a lead frame having a die attach area and a plurality of leads extending from a connection bar that encircles the die attach area towards the die attach area, wherein the plurality of leads have a distal end connected to the connection bar and a proximal end near the die attach area;
attaching a semiconductor die to the die attach area;
electrically coupling contact pads on the semiconductor die with the proximal ends of respective ones of the plurality of leads;
providing a mold chase comprising:
a first toothed mold clamp having a plurality of teeth, a corresponding plurality of recesses located between the teeth and an open cavity located in a center of the first mold clamp, and
a second toothed mold clamp having a plurality of teeth, a corresponding plurality of recesses located between the teeth and an open cavity located in a center of the second mold clamp, wherein the second mold clamp is in facing arrangement with the first mold clamp and wherein the teeth in the first mold clamp mate with corresponding recesses in the second mold clamp and vice-versa;
inserting the lead frame and the semiconductor die between the first and second mold clamps while the mold chase is in an open position;
clamping the first and second mold clamps to put the mold chase in a closed position, wherein the teeth and recesses of the first and second mold clamps act together to bend the leads of the lead frame into two spaced, planar rows;
injecting mold compound into the cavity of the mold chase to encapsulate at least the die, the die attach area and the proximal ends of the plurality of leads; and
removing the connection bar, wherein the distal ends of the plurality of leads project outwardly from the mold compound.

11. The method of packaging a semiconductor device using a mold chase of claim 10, wherein the teeth of the first mold clamp are wider than the corresponding recesses of the second mold clamp.

12. The method of packaging a semiconductor device using a mold chase of claim 10, wherein the teeth of at least one of the first and second mold clamps are chamfered, wherein the chamfers act as guides to align the leads of the lead frame within the recesses of the at least one of the first and second mold clamps.

13. The method of packaging a semiconductor device using a mold chase of claim 12, wherein the chamfer is formed by a wire cutting process.

14. The method of packaging a semiconductor device using a mold chase of claim 12, wherein the teeth of both the first and second mold clamps are chamfered and chamfered edges of the teeth of the first mold clamp mate with chamfered edges of the corresponding recesses of the second mold clamp.

15. The method of packaging a semiconductor device using a mold chase of claim 10, wherein in the closed position distal ends of the teeth of the first mold clamp are spaced from proximal ends of the corresponding recesses of the second mold clamp.

16. The method of packaging a semiconductor device using a mold chase of claim 15, wherein in the closed position a distance between the distal ends of the teeth of the first mold clamp and the proximal ends of the corresponding recesses of the second mold clamp is less than a thickness of the leads of the lead frame such that there are no gaps between the leads and the recesses in the second mold clamp when the leads are pressed into the recesses in the second mold clamp by the corresponding teeth in the first mold clamp.

17. The method of packaging a semiconductor device using a mold chase of claim 16, wherein in the closed position the distance between the distal ends of the teeth of the first mold clamp and the proximal ends of the corresponding recesses of the second mold clamp is less than a thickness of the leads of the lead frame by 5 µm to 15 µm.

18. The method of packaging a semiconductor device using a mold chase of claim 10, wherein an outer edge located adjacent to an outermost tooth of the second mold clamp is removed.

* * * * *